United States Patent [19]
Horsfall et al.

[11] Patent Number: 5,493,713
[45] Date of Patent: Feb. 20, 1996

[54] DEMODULATION OF FM AUDIO CARRIER

[75] Inventors: Wayne L. Horsfall, Buckinghamshire, United Kingdom; Gary Shipton, Valsorey, France

[73] Assignee: SGS–Thomson Microelectronics Limited, United Kingdom

[21] Appl. No.: 175,785

[22] Filed: Dec. 30, 1993

[30]  Foreign Application Priority Data

Sep. 29, 1993 [GB]  United Kingdom .................. 9320068

[51] Int. Cl.$^6$ ..................................................... H04B 1/06
[52] U.S. Cl. ................................... 455/236.1; 455/234.1; 455/260; 375/345; 375/376; 329/325
[58] Field of Search ................................ 455/183.1, 214, 455/234.1, 236.1, 260, 246.1, 232.1, 239.1, 240.1; 375/98, 345, 376; 329/321, 325, 319

[56]  References Cited

U.S. PATENT DOCUMENTS 4,185,243  1/1980  Brown .
4,600,890  7/1986  Horvat ..................................... 329/319
4,605,904  8/1986  Hajj-Chehade ......................... 329/325
4,926,141  5/1990  Herold et al. ............................ 455/260
5,017,841  5/1991  Miura ....................................... 455/260

FOREIGN PATENT DOCUMENTS 0398254  11/1990  European Pat. Off. .
0425267   5/1991  European Pat. Off. .
62-012288  1/1987  Japan .

Primary Examiner—Reinhard J. Eisenzopf
Assistant Examiner—Doris To
Attorney, Agent, or Firm—Bradley, Felsman, Gunter & Dillon

[57]  ABSTRACT

A method of demodulating an FM carrier wave and a demodulating circuit are described which utilize a gain control circuit. An output is supplied from the gain control circuit to a phase locked loop circuit tuned to a selected carrier wave frequency. A first output of the phase locked loop circuit is used to generate a tuned gain control signal dependent on the amplitude of the input FM carrier wave to which the phase locked loop is tuned and the tuned gain control signal is used to control the gain of the gain control circuit.

19 Claims, 1 Drawing Sheet

DEMODULATION OF FM AUDIO CARRIER

FIELD OF THE INVENTION

The invention relates to the demodulation of FM carrier waves to generate an audio signal and particularly to apparatus for, and methods of, demodulation of an FM sound carrier when a plurality of carrier frequencies are present.

BACKGROUND TO THE INVENTION

The present invention is particularly applicable to satellite receiver sound demodulation where a plurality of carrier frequencies of 5 MHz to 10 MHz may be present. The modulation of each carrier wave may vary from +50 KHz to +200 KHz and the carrier frequency separation will commonly be greater than 180 KHz. The frequency modulation of each carrier will be such as to avoid frequency overlap of adjacent carrier waves due to their respective modulations. Such systems may be used to produce hi-fi quality audio sound.

Known demodulation systems for such FM sound carriers normally translate the frequency of the selected carrier to a known frequency and the signal is then processed by a single high Q narrow band pass filter. The single carrier frequency is then FM demodulated. Each of the carrier frequencies in the composite signal must be shifted to the same known frequency when it is required to tune onto that selected carrier frequency. To handle stereo signals two such filters are required and as the band pass filter used will have a selected band width, it is necessary to use a plurality of filters to allow for the variation in modulation which may be permitted for different carrier frequencies. The use of such frequency translation when using a common filter presents more problems in providing an economic solution on integrated circuit chips.

Phase locked loops have been used for FM demodulation but have presented problems where a plurality of carrier waves of close frequency have been present. Such phase locked loop circuits have presented problems of stability due to variable gain with process variations particularly on an integrated circuit implementation and they have also been sensitive to variations in the input signal amplitude.

It is an object of the present invention to provide an improved apparatus and method for FM sound carrier demodulation using a phase locked loop.

SUMMARY OF THE INVENTION

The invention provides a method of demodulating an FM carrier wave to generate an audio signal, which method comprises supplying an FM input signal to a gain control circuit, supplying an output from the gain control circuit to a phase locked loop circuit tuned to a selected carrier wave frequency, providing a first output of the phase locked loop, using said first output to generate a tuned gain control signal dependent on the amplitude of the carrier wave to which the phase locked loop is tuned, using said tuned gain control signal to control said gain control circuit, and providing a second output of the phase locked loop representing the demodulated audio signal.

Preferably said FM input signal is a composite signal comprising a plurality of carrier waves of different frequencies, an untuned gain control signal is formed in dependence on the amplitude of the plurality of carrier waves in the input signal and said untuned gain control signal is used as a control signal for said gain control circuit.

Preferably the untuned gain control represents the peak amplitude of the composite FM input signal.

Preferably said untuned gain control signal is used to control the gain control circuit prior to locking of the phase locked loop onto the selected carrier frequency and said tuned gain control signal is used to control the gain control circuit after said locking.

Preferably said phase locked loop includes a voltage controlled oscillator arranged to provide two outputs with a phase difference of 90°, one of said outputs being supplied to a phase comparator coupled to receive the output of the gain control circuit and the other of said outputs being coupled to an amplitude detector coupled to receive the output of the said gain control circuit.

Preferably said phase comparator and amplitude detector operate with the same gain.

Preferably the gain of the phase locked loop is selected to match a desired bandwidth of the selected carrier wave.

The invention provides a demodulating circuit for generating an audio signal from an FM carrier wave, which circuit comprises a gain control circuit for receiving an FM input signal, a phase locked loop circuit coupled to the gain control circuit for locking onto a selected carrier wave frequency, said phase locked loop circuit having a phase detector for tracking frequency variation in said carrier wave and an amplitude detector for detecting amplitude variation in said selected carrier wave and providing a tuned gain control signal, said amplitude detector being coupled to said gain control circuit to control the gain of said gain control circuit when the phase locked loop circuit is locked onto the selected carrier wave.

Where the FM input signal is a composite signal comprising a plurality of carrier waves there is preferably a further amplitude detecting circuit coupled to receive a signal dependent on the amplitude of the FM input signal and generate an untuned gain control signal dependent upon the peak value of the composite FM input signal, said amplitude detecting circuit being connected to supply the untuned gain control signal to the gain control circuit.

Preferably said phase locked loop circuit includes a voltage controlled oscillator arranged to provide two outputs with a 90° phase separation, said phase detector being connected to one of said outputs and said amplitude detector being connected to the other of said outputs.

Preferably said phase detector and said amplitude detector each comprise a circuit of the same gain.

Preferably said phase detector and said amplitude detector comprise similar mixer circuits each arranged to receive respective outputs from the voltage controlled oscillator and the same output from the gain control circuit.

Preferably the phase locked loop circuit includes a low pass loop filter.

Preferably the phase locked loop has a gain matching the bandwidth of the selected carrier wave.

An embodiment of the invention will now be described by way of example and with reference to the accompanying drawing.

DESCRIPTION OF THE PREFERRED EMBODIMENT

Figure 1:
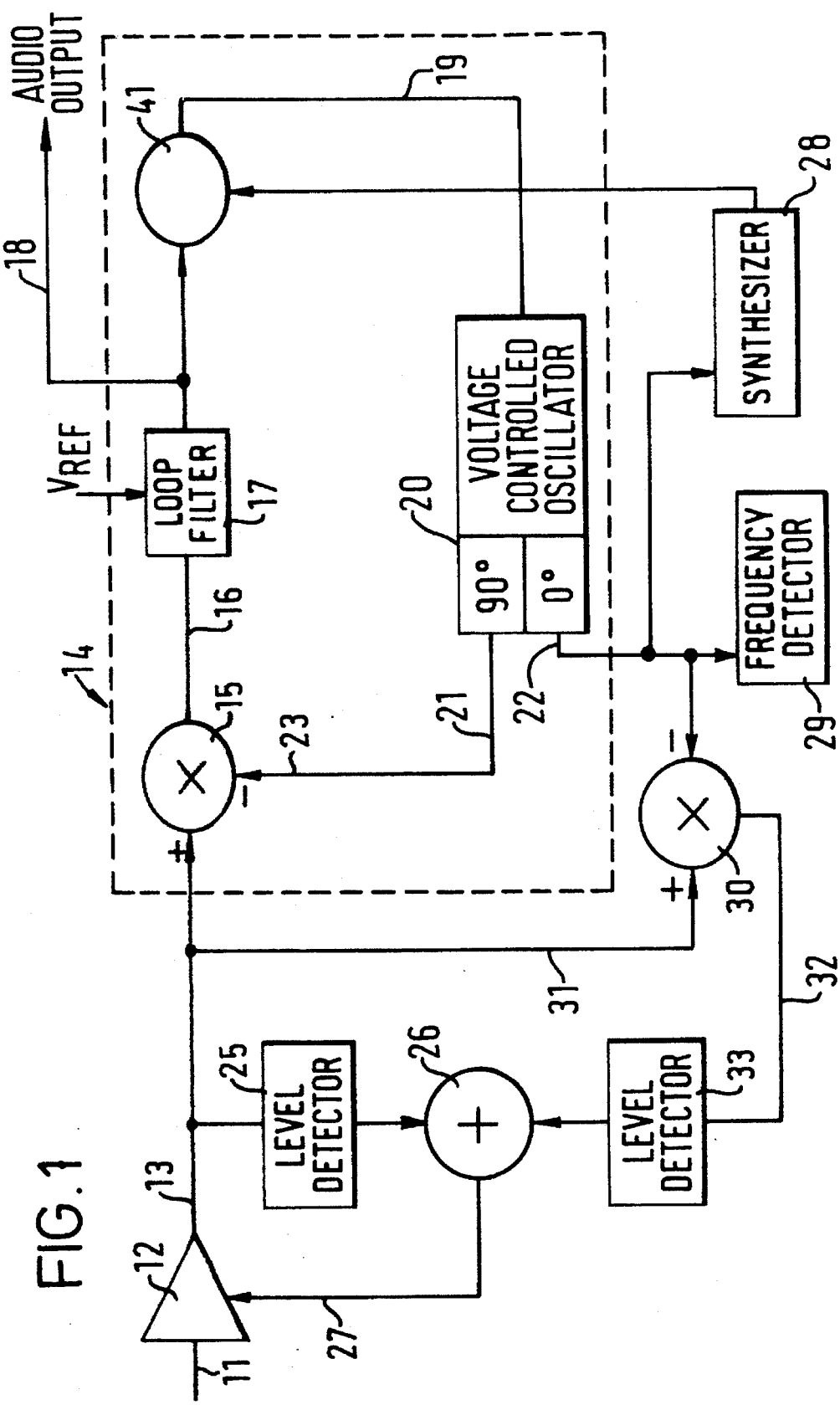
FIG. 1 shows a schematic diagram of an FM sound carrier demodulating circuit.

In this example an input signal 11 comprises a plurality of FM sound carriers received by, for example, a satellite receiver each carrier being in the range of 5 MHz to 10 MHz with a modulation varying between ±50 KHz to ±200 KHz. Each of the carrier frequencies is separated from an adjacent carrier by more than 180 KHz and the modulation of each signal is arranged not to give a frequency overlap with the modulation of any adjacent carrier wave. The input signal 11 is fed to an automatic gain control circuit 12 having an output 13 forming an input to a phase locked loop circuit 14. The phase locked loop includes a phase detector 15 having an output 16 connected to a loop filter 17 acting as a low pass filter arranged to pass audio signals, for example up to 20 KHz, without attenuation but with a sharp increase in attenuation at frequencies above this with particularly heavy attenuation of signals at 80 KHz. The output of the filter 17 forms an audio output 18 and a voltage input 19 to a voltage controlled oscillator 20 via a voltage divider circuit 41. The voltage controlled oscillator 20 is arranged to provide two outputs 21 and 22 with a 90° phase separation between them. Output 21 forms a second input 23 to the phase detector 15. In known manner for using a phase locked loop for demodulation, the phase detector 15 provides an output 16 used to control the voltage oscillator 20 so that the voltage controlled oscillator 20 tracks frequency variations in the input signal 13 to the phase locked loop. In tracking those frequency variations the variation in voltage on lines 18 and 19 represents the modulation and thereby the audio signal carried by the input carrier wave on line 13. In the present case the phase detector 15 is arranged to provide a current output signal which is converted to a voltage signal by the loop filter 17 and that voltage is used as an input to the voltage controlled oscillator 20. The phase detector 15 comprises a Gilbert multiplier circuit arranged to provide a current output having a magnitude representing phase difference between the input signals 13 and 23 when they have the same frequency, representing the rate of change of frequency in the input signal 13. When the input signals 13 and 23 have a different frequency the output of the phase detector 15 is a periodic output at the difference frequency.

It will be understood that the FM input signal 11 consists of a plurality of carrier waves of different frequencies and amplitudes. In this case, the output of the phase detector will consist of a signal representing the rate of change of frequency or FM modulation of the carrier wave at the locked on frequency and signals at the difference frequencies between the locked on frequency and the frequency of each of the other carrier waves.

Prior to locking on, the output 13 of the gain control circuit 12 is supplied to a first level detector 25 which measures the peak amplitude of all carrier waves on line 13. This is fed through a summing circuit 26 to line 27 forming an input to the automatic gain control 12. In this way the gain effected by the gain control circuit 12 is dependent on the peak amplitude of the carrier waves on line 13. This puts the amplitude of the input signals forming an input to phase detector 15 within an amplitude range to which the detector can respond. The phase locked loop is tuned to a selected carrier frequency by use of a synthesizer 28 which provides a voltage input to the voltage controlled oscillator 20 via the voltage divider circuit 41 to bring it to an output frequency corresponding to the required carrier frequency. The voltage divider circuit 41 is not a true voltage divider but provides a translated voltage to the VCO 20. A simple implementation is a series resistance network having two resistors connected to a common node, where $R_1$ and $R_2$ are the values of the resistors in the resistive network. The output to the VCO 20 is taken at the common node between $R_1$ and $R_2$, where $R_2$ is connected to the synthesizer 28 and $R_1$ is connected to the loop filter 17. The "divider ratio"

$$r = \frac{R_2}{R_1 + R_2}$$

and is set to be much less than 1. This arrangement has several advantages. Principally, it allows the VCO 20 to be controlled not only as part of the PLL 14 of the invention for FM demodulation but also to be used to set the operating carrier frequency of the PLL using the frequency synthesizer 28. This obviates the need for a separate local oscillator within the synthesizer 28. Provided that the dividing ratio is set to be much greater than one, the VCO 20 will appear to have a large dynamic range from the point of view of adjustment by the synthesizer but to be sensitive over a smaller range as seen within the PLL 14. Thus, the effective slope S for the VCO 20 when controlled by the synthesizer is S MHz/V, while the effective slope for the VCO 20 when operating within the PLL is rS MHz/V. It also allows the audio level taken out of the PLL on line 18 to be delivered at its maximum. For example, the gain of the PLL can be set to deliver an audio level of IV peak to peak. Furthermore, the audio bias can be maintained at a preset level, for example 2.4 V, by the voltage reference at the loop filter Vref. Both of these conditions can be achieved because the audio signal is taken upstream of the voltage divider circuit 41 and so is not affected by the signal reduction therein.

During tuning, one input to the circuit 41 is set at VREF and the control voltage to the VCO is a function of this and the tuning voltage output from the synthesizer 28. During normal operation, that one input is the audio input signal, while the set tuning voltage provides the reference for the circuit 41. This is described in more detail in our application U.S. Ser. No. 176,342 filed Dec. 30, 1993 (Page White & Farrer Ref. 74496) incorporated herein by reference.

A frequency detector 29 is connected to receive the output 22 of the VCO 20 to monitor the frequency of the PLL. The output 22 from the oscillator 20 is also supplied to the synthesizer 28 so as to adjust the input voltage to the oscillator 20 until it is providing an output on lines 21 and 22 which is equal to that of the carrier frequency to which the PLL is tuned. As a practical matter, there could be a variation of up to about 10 KHz between the actual carrier frequency and the frequency output in lines 21 and 22. At this point the phase detector 15 will be receiving the tuned carrier frequency on input 23 and the composite carrier frequency signals on line 13. The phase locked loop 14 will act to lock onto the selected carrier frequency which is input on line 13. The phase detector 15 will compare the input 23 with all carrier frequencies arriving on the line 13 but in the case of all carrier frequencies other than the selected carrier frequency, the output on line 16 will have a high frequency representing the difference between the frequency of signal on line 23 and the various carrier frequencies. The low pass filter 17 will filter out all signals which result from comparison of input 23 with carrier frequencies other than the selected frequency. As the frequency of the selected carrier varies due to its modulation, the phase detector 15 will provide an output signal 16 which generates a voltage input at 19 to the voltage controlled oscillator 20 to make the voltage controlled oscillator track the modulation of the selected carrier wave. It is important that this tracking should be independent of the amplitude of the selected carrier wave. For this reason the output 22 of the voltage controlled oscillator 20 is supplied to the further mixer circuit 30 which is of the same construction as the mixer 15. The mixer 30 has an input 31 derived from line 13 as well as the input derived from line 22 from the voltage controlled oscillator 20. Due to the 90° phase shift between lines 21 and 22 the mixer 15 will act as a phase detector for the selected carrier frequency and mixer 30 will act as an amplitude detector for the selected carrier frequency. In this way mixer 30 provides an output 32 which represents the amplitude of the selected carrier wave at any time and this is fed through a further level detector circuit 33 providing an input through unit 26 to line 27 and thereby control the automatic gain control unit 12. In this way, level detector 25 initially provides an untuned gain control which controls the operation of the automatic gain control circuit 12 setting a maximum level for the output signal 13. Once the phase locked loop 14 has locked onto the selected carrier frequency the signal derived from level detector 33 provides a tuned gain control which overrides control of the automatic gain control circuit 12 so as to control the signal level on line 13 in dependence on the amplitude of the tuned carrier frequency. The level detector 33 operates to vary the gain control 12 to signal levels below that initially set by level detector 25. In this way the input on line 13 to the phase detector 15 has a constant amplitude at the tuned carrier frequency. In this case the phase locked loop 14 is formed as a single integrated circuit on a single chip and the mixer 30 is formed on the same integrated circuit chip and has the same circuit design and made by the same process of manufacture so that the gain characteristics of mixer 30 are the same as those for mixer 15. In this way, the phase locked loop 14 automatically compensates for any amplitude variation of the carrier wave to which it is tuned. Also, process variations in the mixers are compensated for.

The gain of the phase locked loop is carefully controlled so as to produce a stable loop producing rapid and stable lock onto the tuned frequency. The gain of the loop can be altered by altering the divider ratio, r, in the voltage divider circuit 41. The gain is such that the voltage controlled oscillator 20 provides a frequency variation on line 23 matching the required bandwidth of the carrier wave to which the PLL is tuned. By control of the bandwidth the lock range of the PLL circuit is controlled so as to avoid locking onto signals having bandwidths outside the desired lock range. Similarly the capture range of the circuit is determined by the time constant of the loop filter 17. This is arranged to limit the variation of input frequency from the tuned carrier frequency which can be captured by the PLL. As the gain of the phase detector 15 is dependent on the amplitude of the input signal on line 13 the stabilization of amplitude which is achieved for the tuned carrier wave frequency results in a stabilized gain for that carrier frequency assisting in stable locking onto the required carrier frequency. In this way the control of the automatic gain control circuit 12 in dependence on the amplitude detected by the mixer 30 prevents a tendency for the loop to jump onto unwanted carrier frequencies.

The invention is not limited to the details of the foregoing example.

What is claimed is:

1. A method of generating an audio signal from an FM input signal which method comprises:

supplying to a gain control circuit said FM input signal comprising a plurality of carrier waves each having a frequency and an amplitude;

supplying an output from the gain control circuit to a phase locked loop circuit tuned to a selected one of the frequencies of the plurality of carrier waves;

detecting the amplitude of the carrier wave having the frequency to which the phase locked loop is tuned;

generating a tuned gain control signal representing the detected amplitude of the carrier wave having the frequency to which the phase locked loop is tuned;

detecting a sum of the amplitudes of the plurality of carrier waves in the FM input signal;

generating an untuned gain control signal representing the sum of said amplitudes;

using said untuned gain control signal to control the gain control circuit prior to locking of the phase locked loop onto the selected frequency; and using said tuned gain control signal to control the gain control circuit after said locking, wherein an output of the phase locked loop provides said audio signal.

2. A method according to claim 1 in which said phase locked loop includes a voltage controlled oscillator arranged to provide two outputs with a phase difference of 90°, one of said outputs being supplied to a phase comparator coupled to receive the output of the gain control circuit and the other of said outputs being coupled to an amplitude detector for detecting the amplitude of the carrier wave having the frequency to which the phase locked loop is tuned and coupled to receive the output of the gain control circuit.

3. A method according to claim 2 in which said phase comparator operates with a gain which is the same as a gain of said amplitude detector.

4. A method according to claim 2 in which the voltage controlled oscillator of the phase locked loop is set up with a default power up frequency matching that of the selected carrier frequency.

5. A method according to claim 4 wherein the default power up frequency is generated by the voltage controlled oscillator in response to a control voltage supplied from a signal translation circuit with respect to a tuning voltage.

6. A method according to claim 2 in which the phase locked loop has a gain which is selected to match a desired bandwidth of the selected carrier wave.

7. A method according to claim 1 in which the phase locked loop has a gain which is selected to match a desired bandwidth of the selected carrier wave.

8. A method according to claim 1 in which the plurality of carrier waves are in the frequency range 5 MHz to 10 MHz.

9. A method according to claim 8 in which each carrier wave has a bandwidth in the range ±50 KHz to ±200 KHz.

10. A method according to claim 9 in which the separation of the carrier wave frequencies is greater than 180 KHz.

11. A method of generating a stereo audio signal from an FM input signal which method comprises demodulating two channels of the stereo signal by use of respective phase locked loop circuits each operating according to the method comprising:

supplying to a gain control circuit said FM input signal comprising a plurality of carrier waves each having a frequency and an amplitude;

supplying an output from the gain control circuit to a phase locked loop circuit tuned to a selected one of the frequencies of the plurality of carrier waves;

detecting the amplitude of the carrier wave having the frequency to which the phase locked loop is tuned;

generating a tuned gain control signal representing the detected amplitude of the carrier wave having the frequency to which the phase locked loop is tuned;

detecting the sum of the amplitudes of the plurality of carrier waves in the FM input signal;

generating an untuned gain control signal representing the sum of said amplitudes;

using said untuned gain control signal to control the gain control circuit prior to locking of the phase locked loop onto the selected frequency; and using said tuned gain control signal to control the gain control circuit after said locking, wherein an output of the phase locked loop provides said audio signal.

12. A demodulating circuit for generating an audio signal from an FM input signal, which circuit comprises:

a gain control circuit for receiving said FM input signal comprising a plurality of carrier waves each having a frequency and an amplitude;

a phase locked loop circuit coupled to the gain control circuit for locking onto a selected one of the frequencies of the plurality of carrier waves, said phase locked loop circuit having a phase detector for tracking frequency variation in the carrier wave having said selected frequency;

a tuned amplitude detecting circuit for detecting amplitude variation in said carrier wave having said selected frequency, said tuned amplitude detecting circuit further providing a tuned gain control signal; and an untuned amplitude detecting circuit coupled to receive the FM input signal to detect the sum of the amplitudes of the plurality of carrier waves in the FM input signal and generate an untuned gain control signal dependent upon the sum of said amplitudes, said tuned amplitude detecting circuit being coupled to said gain control circuit for said tuned gain control signal to control the gain of said gain control circuit when the phase locked loop circuit is locked onto the selected carrier wave and said untuned amplitude detecting circuit being coupled to said gain control circuit for said untuned gain control signal to control the gain control circuit prior to said phase locked loop being locked.

13. A demodulating circuit according to claim 12 in which said phase detector comprises a circuit with a gain which is the same as a gain of a circuit comprised in said tuned amplitude detecting circuit.

14. A demodulating circuit according to claim 12 in which said phase locked loop circuit includes a voltage controlled oscillator arranged to provide two outputs with a 90° phase separation, said phase detector being connected to one of said outputs and said tuned amplitude detecting circuit being connected to the other of said outputs.

15. A demodulating circuit according to claim 14 including a signal translation circuit connected between an output of the phase detector and an input to the voltage controlled oscillator, for adjusting a level of a signal on the input to the voltage controlled oscillator.

16. A demodulating circuit according to claim 15 including a set up circuit connected to the signal translation circuit for supplying a set up voltage to the voltage controlled oscillator for setting a default power up frequency.

17. A demodulating circuit according to claim 14 in which said phase detector and said tuned amplitude detecting circuit comprise similar mixer circuits each arranged to receive respective outputs from the voltage controlled oscillator and the same output from the gain control circuit.

18. A demodulating circuit according to claim 12 in which the phase locked loop circuit includes a low pass loop filter connected to an output of the phase detector.

19. A demodulating circuit according to claim 12 in which the phase locked loop has a gain which matches a bandwidth of the selected carrier wave.

\* \* \* \* \*